United States Patent
Lee et al.

(10) Patent No.: US 12,491,547 B2
(45) Date of Patent: Dec. 9, 2025

(54) CHEMICAL LIQUID PROVIDING UNIT AND SUBSTRATE TREATING APPARATUS INCLUDING THE SAME

(71) Applicant: SEMES Co., Ltd., Chungcheongnam-do (KR)

(72) Inventors: Gun Min Lee, Chungcheongnam-do (KR); Do Gyeong Ha, Daegu (KR); Moon Soon Choi, Chungcheongnam-do (KR); Chae Young Lim, Chungcheongnam-do (KR); Jae Hyeok Yu, Gyeonggi-do (KR)

(73) Assignee: SEMES CO., LTD., Cheonan-Si (KR)

( * ) Notice: Subject to any disclaimer, the term of this patent is extended or adjusted under 35 U.S.C. 154(b) by 701 days.

(21) Appl. No.: 17/694,828

(22) Filed: Mar. 15, 2022

(65) Prior Publication Data
US 2022/0297169 A1 Sep. 22, 2022

(30) Foreign Application Priority Data
Mar. 17, 2021 (KR) .......................... 10-2021-0034557

(51) Int. Cl.
*B08B 13/00* (2006.01)
*B08B 3/08* (2006.01)
(Continued)

(52) U.S. Cl.
CPC .............. *B08B 13/00* (2013.01); *B08B 3/08* (2013.01); *B08B 3/10* (2013.01); *H01L 21/67023* (2013.01); *B08B 2203/007* (2013.01)

(58) Field of Classification Search
CPC ......... H01L 21/67248; H01L 21/67051; H01L 21/67017; H01L 21/67057; H01L 21/6715;
(Continued)

(56) References Cited

U.S. PATENT DOCUMENTS 6,207,937 B1 * 3/2001 Stoddard ................ C30B 25/10
392/416
10,121,685 B2 * 11/2018 Shite ................ H01L 21/67017
(Continued)

FOREIGN PATENT DOCUMENTS

JP  2018163977 A  * 10/2018  ....... H01L 21/67109
JP  2021163845 A  * 10/2021
(Continued)

OTHER PUBLICATIONS

Korean Written Decision on Registration for Korean Application No. 10-2021-0034557, dated Oct. 10, 2023 with translation, 4 pages.

*Primary Examiner* — Michael E Barr
*Assistant Examiner* — Thomas Bucci
(74) *Attorney, Agent, or Firm* — Buchanan Ingersoll & Rooney P.C.

(57) ABSTRACT

Provided are a treating liquid providing unit capable of predicting a temperature change of a substrate treating liquid by adding an inflow amount or consumption amount of the substrate treating liquid as a control factor, and a substrate treating apparatus including the same. The treating liquid providing unit includes a treating liquid storage module for storing the substrate treating liquid, a treating liquid heating module for heating the substrate treating liquid, a treating liquid discharging module for discharging the substrate treating liquid, a treating liquid supplying module for supplying the substrate treating liquid to the treating liquid storage module when the substrate treating liquid is discharged, and a control module for predicting the temperature of the substrate treating liquid remaining in the treating liquid storage module based on the inflow amount of the substrate treating liquid.

20 Claims, 10 Drawing Sheets

(51) Int. Cl.
 B08B 3/10 (2006.01)
 H01L 21/67 (2006.01)

(58) Field of Classification Search
 CPC ......... H01L 21/67253; H01L 21/67103; B08B
  13/00; B08B 3/08; B08B 3/10; B08B
  2203/007; B08B 3/02
 USPC .......................................................... 134/56
 See application file for complete search history.

(56) References Cited

U.S. PATENT DOCUMENTS

| | | | | |
|---|---|---|---|---|
| 10,276,408 B2* | 4/2019 | Amiya | ................... | B08B 3/08 |
| 10,422,551 B2 | 9/2019 | Nakayama et al. | | |
| 11,664,212 B2* | 5/2023 | Hong | ................ | H01L 21/02057 |
| | | | | 438/761 |
| 11,691,172 B2* | 7/2023 | Nobukuni | ........... | B05C 11/1039 |
| | | | | 137/334 |
| 2001/0001924 A1* | 5/2001 | Maehashi | .......... | G05D 23/1919 |
| | | | | 62/3.2 |
| 2002/0045146 A1* | 4/2002 | Wang | ................ | H01L 21/67109 |
| | | | | 432/49 |
| 2002/0074324 A1* | 6/2002 | Wang | ....................... | C30B 25/16 |
| | | | | 219/390 |
| 2004/0154641 A1* | 8/2004 | Montierth | ............. | B08B 7/0021 |
| | | | | 257/E21.309 |
| 2006/0188240 A1* | 8/2006 | Tanaka | .............. | H01L 21/67109 |
| | | | | 392/416 |
| 2006/0225769 A1* | 10/2006 | Goshi | ............... | H01L 21/67248 |
| | | | | 134/108 |
| 2007/0074660 A1* | 4/2007 | Park | .................. | H01L 21/67248 |
| | | | | 118/715 |
| 2012/0251966 A1* | 10/2012 | Yoshii | ................... | H01L 21/324 |
| | | | | 432/49 |
| 2012/0258415 A1* | 10/2012 | Yoshii | ............... | H01L 21/67248 |
| | | | | 432/9 |
| 2013/0037534 A1* | 2/2013 | Yoshii | ............... | H01L 21/67781 |
| | | | | 219/494 |
| 2014/0231010 A1 | 8/2014 | Park et al. | | |
| 2016/0305688 A1* | 10/2016 | Nakayama | ........ | H01L 21/67051 |
| 2016/0334162 A1* | 11/2016 | Kim | ................... | H01L 21/67109 |
| 2016/0372341 A1* | 12/2016 | Kobayashi | .......... | H01L 21/6715 |
| 2016/0378092 A1* | 12/2016 | Yamamoto | ........... | G05B 19/404 |
| | | | | 700/300 |
| 2017/0066101 A1* | 3/2017 | Yamaguchi | ....... | H01L 21/67046 |
| 2017/0092471 A1* | 3/2017 | Wakai | ............... | H01J 37/32724 |
| 2017/0323813 A1* | 11/2017 | Silveira | ............. | H01L 21/67248 |
| 2018/0065065 A1* | 3/2018 | Sasa | ........................ | G03F 7/16 |
| 2018/0211853 A1* | 7/2018 | Oka | .................. | H01L 21/67253 |
| 2018/0277398 A1* | 9/2018 | Osada | ................ | H01L 21/67051 |
| 2018/0334318 A1 | 11/2018 | Cho et al. | | |
| 2019/0131144 A1* | 5/2019 | Iwahata | .................... | B08B 3/14 |
| 2019/0267267 A1* | 8/2019 | Yamaguchi | ....... | H01L 21/67109 |
| 2019/0376185 A1* | 12/2019 | Yokota | .............. | C23C 16/45572 |
| 2020/0402818 A1* | 12/2020 | Lee | ................... | H01L 21/6715 |
| 2020/0406309 A1* | 12/2020 | Yang | ................ | H01L 21/67017 |
| 2021/0001370 A1* | 1/2021 | Nobukuni | ................. | B05C 3/02 |
| 2021/0028032 A1* | 1/2021 | Ota | ..................... | H01L 21/6708 |
| 2021/0202274 A1* | 7/2021 | Yang | ................ | H01L 21/67017 |

FOREIGN PATENT DOCUMENTS

| | | |
|---|---|---|
| KR | 20070120410 A | 12/2007 |
| KR | 20140103650 A | 8/2014 |
| KR | 20160124003 A | 10/2016 |
| KR | 20180126866 A | 11/2018 |
| KR | 20200138022 A | 12/2020 |
| WO | WO-2019087702 A1 * | 5/2019 ........... H01L 21/306 |

\* cited by examiner

CHEMICAL LIQUID PROVIDING UNIT AND SUBSTRATE TREATING APPARATUS INCLUDING THE SAME

CROSS REFERENCE TO RELATED APPLICATIONS

This application claims the benefit of Korean Patent Application No. 10-2021-0034557, filed on Mar. 17, 2021, in the Korean Intellectual Property Office, the disclosure of which is incorporated herein by reference in its entirety.

FIELD OF THE INVENTION

The present disclosure relates to a treating liquid providing unit and a substrate treating apparatus having the same. More particularly, it relates to a treating liquid providing unit that provides a treating liquid used for treating a substrate, and a substrate treating apparatus including the same.

BACKGROUND OF THE INVENTION

The semiconductor device manufacturing process may be continuously performed in a semiconductor device manufacturing facility, and may be divided into a pre-process and a post-process. The semiconductor manufacturing facility may be installed in a space defined as a FAB to manufacture semiconductor devices.

The pre-process refers to a process of forming a circuit pattern on a substrate (e.g., a wafer) to complete a chip. These pre-processes may comprise a deposition process for forming a thin film on a substrate, a photo lithography process for transferring a photo resist onto a thin film using a photo mask, an etching process for selectively removing unnecessary parts using a chemical material or reactive gas in order to form a desired circuit pattern on a substrate, an ashing process for removing the photoresist remaining after etching, an ion implantation process for implanting ions into the portion connected to a circuit pattern to have characteristics of an electronic device, a cleaning process for removing contamination sources from the substrate, and the like.

The post-process refers to the process of evaluating the performance of the product finished through the pre-process. The post-process may comprise a board inspection process fort determining good products or defective products by inspecting the operation of each chip on the board, a package process for cutting and separating each chip through dicing, die bonding, wire bonding, molding, marking, etc. to have the shape of the product, a final inspection process for finally inspecting product characteristics and reliability through electrical characteristic inspection and burn-in inspection, and the like.

SUMMARY OF THE INVENTION

In the process of treating the substrate, the substrate may be treated using a chemical solution. In this case, the chemical solution supplying device may be connected to the substrate treating apparatus through a pipe of a predetermined length or the like to supply the chemical solution to the substrate treating apparatus.

The chemical solution may be maintained at a constant temperature for treating the substrate. However, when the chemical solution supplying device is based on a single tank, since the chemical solution is frequently replenished according to the use of the chemical solution, it is difficult to maintain a constant temperature of the chemical solution supplied to the substrate treating apparatus.

Also, previously, it was impossible to grasp the replenishment capacity of the chemical solution, so it was impossible to predict the temperature change of the chemical solution.

An aspect of the present disclosure is a treating liquid providing unit capable of predicting a temperature change of a substrate treating liquid by adding an inflow or consumption amount of the substrate treating liquid as a control factor, and a substrate treating apparatus having the same.

The aspects of the present disclosure are not limited to the aspect mentioned above, and other aspects not mentioned will be clearly understood by those skilled in the art from the following description.

One aspect of the treating liquid providing unit of the present disclosure for achieving the above object comprises a treating liquid storage module for storing a substrate treating liquid; a treating liquid heating module for heating the substrate treating liquid; a treating liquid discharging module for discharging the substrate treating liquid; a treating liquid supplying module for supplying the substrate treating liquid to the treating liquid storage module in response to the substrate treating liquid being discharged; and a control module for predicting a temperature of the substrate treating liquid remaining in the treating liquid storage module based on an inflow amount of the substrate treating liquid.

Wherein the control module may recognize an inflow amount of the substrate treating liquid based on a discharge amount of the substrate treating liquid.

Wherein the control module may recognize an inflow amount of the substrate treating liquid as a value equal to a discharge amount of the substrate treating liquid.

Wherein the treating liquid providing unit may further comprise a first inflow amount measuring module for measuring an inflow amount of the substrate treating liquid supplied from the treating liquid supplying module to the treating liquid storage module.

Wherein the first inflow amount measuring module may operate in response to an inflow amount of the substrate treating liquid and a discharge amount of the substrate treating liquid being different from each other.

Wherein the treating liquid providing unit may further comprise a drain valve for discharging the substrate treating liquid that has passed through the treating liquid heating module to an outside.

Wherein the drain valve may discharge the substrate treating liquid that has passed through the treating liquid heating module to an outside in response to the treating liquid heating module being stopped.

Wherein the treating liquid storage module may store the substrate treating liquid up to a first height in a normal state, and store the substrate treating liquid up to a second height higher than the first height in an emergency state.

Wherein the treating liquid storage module may store the substrate treating liquid up to the second height in response to the treating liquid heating module being stopped.

Wherein the treating liquid providing unit may further comprise a second temperature measuring sensor for measuring a temperature of the substrate treating liquid in response to the substrate treating liquid that has passed through the treating liquid heating module inflowing back into the treating liquid storage module; and a second inflow amount measuring module for measuring an amount of the substrate treating liquid in response to the substrate treating liquid that has passed through the treating liquid heating module inflowing back into the treating liquid storage module.

Wherein the treating liquid providing unit may further comprise a feedback line for connecting a rear end of the treating liquid heating module with a front end of the treating liquid heating module; a first on-off valve installed on a pipe connecting a rear end of the treating liquid heating module and the treating liquid discharging module; and a second on-off valve installed on the feedback line.

Wherein the treating liquid providing unit may further comprise a first temperature measuring sensor for measuring a temperature of the substrate treating liquid that has passed through the treating liquid heating module, wherein the control module may control opening and closing of the first on-off valve and the second on-off valve according to a measuring result of the first temperature measuring sensor.

Wherein the treating liquid providing unit may further comprise a bypass line bypassing the treating liquid heating module; a third on-off valve installed at a front end of the treating liquid heating module; and a fourth on-off valve installed on the bypass line.

Wherein the control module bypasses the substrate treating liquid circulating through the bypass line in response to the treating liquid heating module being stopped.

Another aspect of the treating liquid providing unit of the present disclosure for achieving the above object comprises a treating liquid storage module for storing a substrate treating liquid; a treating liquid heating module for heating the substrate treating liquid; a treating liquid discharging module for discharging the heated substrate treating liquid; a treating liquid supplying module for supplying the substrate treating liquid to the treating liquid storage module in response to the substrate treating liquid being discharged; a first inflow amount measuring module for measuring an amount of the substrate treating liquid supplied from the treating liquid supplying module to the treating liquid storage module; and a control module for predicting a temperature of the substrate treating liquid remaining in the treating liquid storage module based on an inflow amount of the substrate treating liquid, wherein the control module recognizes an inflow amount of the substrate treating liquid based on a discharge amount of the substrate treating liquid, or recognizes an inflow amount of the substrate treating liquid based on a measuring result of the first inflow amount measuring module.

One aspect of the substrate treating apparatus of the present disclosure for achieving the above object comprises a treating liquid providing unit for providing a substrate treating liquid; and a substrate treating unit for treating a substrate using the substrate treating liquid, wherein the treating liquid providing unit comprises a treating liquid storage module for storing the substrate treating liquid; a treating liquid heating module for heating the substrate treating liquid; a treating liquid discharging module for discharging the substrate treating liquid; a treating liquid supplying module for supplying the substrate treating liquid to the treating liquid storage module in response to the substrate treating liquid being discharged; and a control module for predicting a temperature of the substrate treating liquid remaining in the treating liquid storage module based on an inflow amount of the substrate treating liquid.

Wherein the substrate treating unit may be a cleaning unit for cleaning the substrate.

Wherein the substrate treating liquid may be IPA.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE INVENTION

Figure 1:
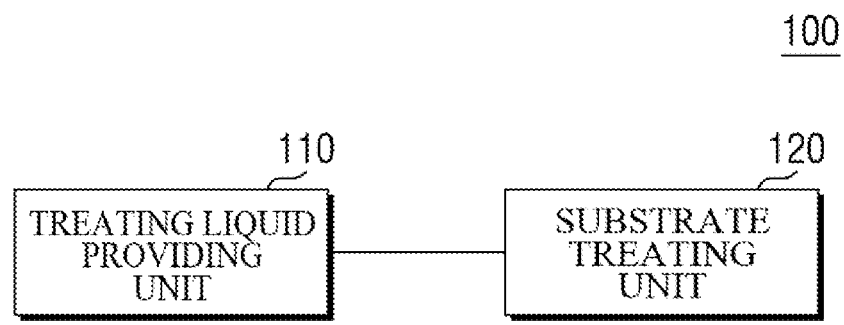
FIG. 1 is a diagram schematically illustrating an internal configuration of a substrate treating apparatus according to an embodiment of the present disclosure.

Hereinafter, preferred embodiments of the present disclosure will be described in detail with reference to the accompanying drawings. Advantages and features of the present disclosure and methods of achieving them will become apparent with reference to the embodiments described below in detail in conjunction with the accompanying drawings. However, the present disclosure is not limited to the embodiments described below, but may be implemented in various different forms, and these embodiments are provided only for making the description of the present disclosure complete and fully informing those skilled in the art to which the present disclosure pertains on the scope of the present disclosure, and the present disclosure is only defined by the scope of the claims. Like reference numerals refer to like elements throughout.

When an element or layer is referred as being located "on" another element or layer, it includes not only being located directly on the other element or layer, but also with intervening other layers or elements. On the other hand, when an element is referred as being "directly on" or "immediately on," it indicates that no intervening element or layer is interposed.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present disclosure.

The terminology used herein is for the purpose of describing the embodiments and is not intended to limit the present disclosure. In the present disclosure, the singular also includes the plural, unless specifically stated otherwise in the phrase. As used herein, "comprises" and/or "comprising" refers to that components, steps, operations and/or elements mentioned does not exclude the presence or addition of one or more other components, steps, operations and/or elements.

Unless otherwise defined, all terms (including technical and scientific terms) used herein may be used with the meaning commonly understood by those of ordinary skill in the art to which the present invention belongs. In addition, terms defined in a commonly used dictionary are not to be interpreted ideally or excessively unless clearly defined in particular.

Hereinafter, embodiments of the present disclosure will be described in detail with reference to the accompanying drawings, and in the description with reference to the accompanying drawings, the same or corresponding components are given the same reference numbers, regardless of reference numerals in drawings, and an overlapped description therewith will be omitted.

The present disclosure relates to a treating liquid providing unit capable of predicting the temperature change of the substrate treating liquid by adding an inflow or consumption amount of the substrate treating liquid as a control factor when the treating liquid providing unit for providing the substrate treating liquid is implemented as a single tank, and a substrate treating apparatus having the same. Hereinafter, the present disclosure will be described in detail with reference to drawings and the like.

FIG. 1 is a diagram schematically illustrating an internal configuration of a substrate treating apparatus according to an embodiment of the present disclosure.

Referring to FIG. 1, the substrate treating apparatus 100 may comprise a treating liquid providing unit 110 and a substrate treating unit 120.

The treating liquid providing unit 110 provides a substrate treating liquid used to treat a substrate to the substrate treating unit 120. The treating liquid providing unit 110 may provide chemical solution to the substrate treating unit 120.

The chemical solution may be a liquid material (e.g., an organic solvent) or a gaseous material. The chemical solution is highly volatile and may contain substances with high persistence since a lot of fumes are generated or viscosity is high. The chemical solution may be selected from, for example, a material containing an IPA (Iso-Propyl Alcohol) component, a material containing a sulfuric acid component (e.g., SPM containing a sulfuric acid component and a hydrogen peroxide component), a material containing an ammonia water component, a material containing a hydrofluoric acid component, a material containing a phosphoric acid component, and the like. Hereinafter, these chemical solutions used to treat the substrate will be defined as the substrate treating liquid.

The treating liquid providing unit 110 may predict a change in temperature of the substrate treating liquid by using an inflow or consumption amount of the substrate treating liquid as a control factor. The treating liquid providing unit 110 may adjust the surface temperature of the heater through this, and may shorten the time, which takes for the substrate treating liquid to reach the target temperature.

A more detailed description of the treating liquid providing unit 110 will be described later with reference to drawings and the like.

The substrate treating unit 120 treats a substrate using the substrate treating liquid supplied by the treating liquid providing unit 110. The substrate treating unit 120 may be a cleaning process chamber that cleans a substrate using the substrate treating liquid.

Figure 2:
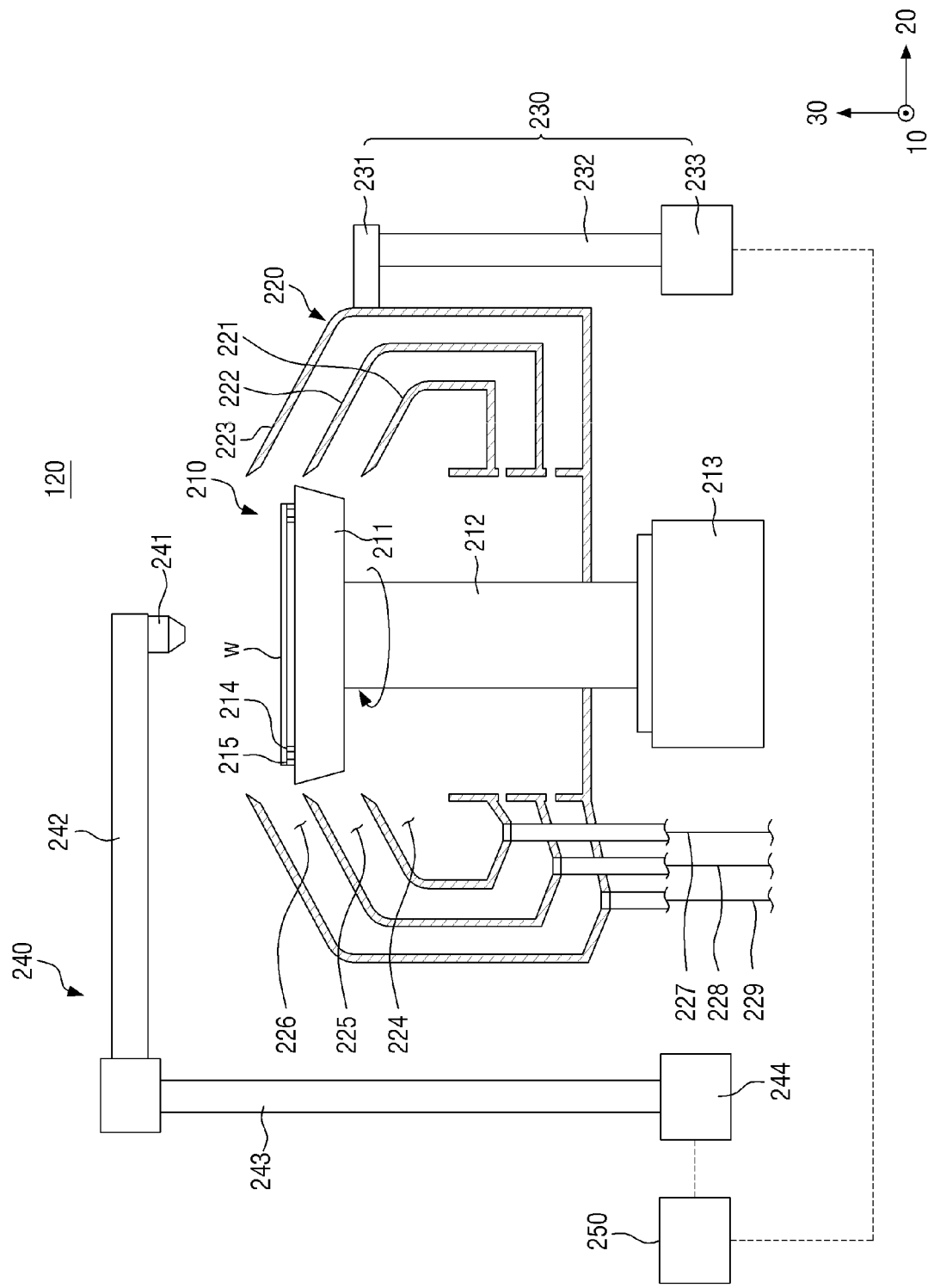
FIG. 2 is a diagram schematically illustrating an internal structure of a substrate treating unit constituting a substrate treating apparatus according to an embodiment of the present disclosure.

When the substrate treating unit 120 is a cleaning process chamber, as shown in FIG. 2, the substrate treating unit 120 may comprise a substrate support module 210, a treating liquid recovery module 220, an elevation module 230, a spraying module 240 and a controller 250.

FIG. 2 is a diagram schematically illustrating an internal structure of a substrate treating unit constituting a substrate treating apparatus according to an embodiment of the present disclosure. The following description refers to FIG. 2.

The substrate support module 210 supports the substrate W. When treating the substrate W, the substrate support module 210 may rotate the substrate W in a direction perpendicular to the third direction 30 (first direction 10 or second direction 20). The substrate support module 210 may be disposed inside the treating liquid recovery module 220 to recover a substrate treating liquid used in treating the substrate W.

The substrate support module 210 may comprise a spin head 211, a rotation shaft 212, a rotation driving unit 213, a support pin 214, and a guide pin 215.

The spin head 211 rotates along the rotation direction (the first direction 10 and the second direction 20) of the rotation shaft 212. The spin head 211 may be provided to have the same shape as that of the substrate W. However, the present embodiment is not limited thereto. The spin head 211 may be provided to have a shape different from that of the substrate W.

The rotation shaft 212 is coupled to the spin head 211 and the rotation driving unit 213 through both ends, respectively. The rotation shaft 212 may rotate with respect to the central axis by the rotational force of the rotation driving unit 213. When the rotational force of the rotation shaft 212 is transmitted to the spin head 211, the spin head 211 rotates, and accordingly, the substrate W fixed on the spin head 211 may also rotate.

The support pin 214 and the guide pin 215 fix the substrate W on the spin head 211. Specifically, the support pin 214 supports the bottom surface of the substrate W on the spin head 211, and the guide pin 215 supports the side surface of the substrate W. A plurality of support pins 214 and guide pins 215 may be respectively installed on the spin head 211.

The support pin 214 may be disposed to have an annular ring shape as a whole. The support pin 214 may support the bottom surface of the substrate W so that the substrate W may be spaced apart from the upper portion of the spin head 211 by a predetermined distance.

The guide pin 215 is a chucking pin, and may support the substrate W so that the substrate W does not deviate from its original position when the spin head 211 rotates.

Meanwhile, a back nozzle (not shown) may also be installed in the upper portion of the spin head 211. The back nozzle is for cleaning the bottom surface of the substrate W. Such a back nozzle is installed in the upper center of the spin head 211, and may spray the substrate treating liquid to the bottom surface of the substrate W.

The treating liquid recovery module 220 recovers the substrate treating liquid used to treat the substrate W. The treating liquid recovery module 220 may be installed to surround the substrate support module 210, and thus may provide a space, in which a treating process for the substrate W is performed.

After the substrate W is seated and fixed on the substrate support module 210, when it starts to rotate by the substrate support module 210, the spraying module 240 may be controlled by the controller 250 to spray the substrate treating liquid onto the substrate W. Then, the substrate treating liquid discharged onto the substrate W may be dispersed in a direction, in which the treating liquid recovery module 220 is located, due to the centrifugal force generated by the rotational force of the substrate support module 210. In this case, the treating liquid recovery module 220 may recover the substrate treating liquid when the substrate treating liquid inflows into the inside through an inlet (i.e., a first opening unit 224 of a first recovery barrel 221, a second opening unit 225 of a second recovery barrel 222, and a third opening unit 226 of a third recovery barrel 223).

The treating liquid recovery module 220 may include a plurality of recovery barrels. The treating liquid recovery module 220 may include, for example, three recovery barrels. When the treating liquid recovery module 220 is configured to include a plurality of recovery barrels as described above, the substrate treating liquid used in the substrate treating process may be separated and recovered using the plurality of recovery barrels, and thus the substrate treating liquid can be recycled.

When the treating liquid recovery module 220 is configured to include three recovery barrels, it may include a first recovery barrel 221, a second recovery barrel 222, and a third recovery barrel 223. The first recovery barrel 221, the second recovery barrel 222, and the third recovery barrel 223 may be implemented as, for example, bowls.

The first recovery barrel 221, the second recovery barrel 222, and the third recovery barrel 223 may recover different substrate treating liquids. For example, the first recovery barrel 221 may recover water, and the second recovery barrel 222 may recover a first chemical solution (e.g., any one of a material containing an IPA component and a material containing an SPM component), and the third recovery barrel 223 may recover the second chemical solution (e.g., the other one of a material containing an IPA component and a material containing an SPM component).

The first recovery barrel 221, the second recovery barrel 222, and the third recovery barrel 223 may be connected with recovery lines 227, 228, 229 extending in a downward direction (the third direction 30) from the bottom surface. The first treating liquid, the second treating liquid, and the third treating liquid recovered through the first recovery barrel 221, the second recovery barrel 222, and the third recover barrel 223 may be treated to be reusable through a treating liquid regeneration system (not shown).

The first recovery barrel 221, the second recovery barrel 222, and the third recovery barrel 223 may be provided in an annular ring shape surrounding the substrate support module 210. The first recovery barrel 221, the second recovery barrel 222, and the third recovery barrel 223 may increase in size from the first recovery barrel 221 to the third recovery barrel 223 (that is, in the second direction 20). The interval between the first recovery barrel 221 and the second recovery barrel 222 is defined as a first interval, and the interval between the second recovery barrel 222 and the third recovery barrel 223 is defined as the second interval. Then, the first interval may be the same as the second interval. However, the present embodiment is not limited thereto. It is also possible that the first interval is different from the second interval. That is, the first interval may be greater than the second interval, and may be smaller than the second interval.

The elevation module 230 linearly moves the treating liquid recovery module 220 in the up-down direction (the third direction 30). The elevation module 230 may serve to adjust the relative height of the treating liquid recovery module 220 with respect to the substrate support module 210 (or the substrate W) through this.

The elevation module 230 may comprise a bracket 231, a first support shaft 232, and a first driving unit 233.

The bracket 231 is fixed to the outer wall of the treating liquid recovery module 220. The bracket 231 may be coupled to the first support shaft 232 that is moved in the up-down direction by the first driving unit 233.

When the substrate W is seated on the substrate support module 210, the substrate support module 210 may be located above the treating liquid recovery module 220. Similarly, even when the substrate W is detached from the substrate support module 210, the substrate support module 210 may be located above the treating liquid recovery module 220. In this case, the elevation module 230 may serve to lower the treating liquid recovery module 220.

When a treating process for the substrate W is performed, according to the type of the substrate treating liquid discharged onto the substrate W, the corresponding treating liquid may be recovered to any one of the first recovery barrel 221, the second recovery barrel 222, and the third recovery barrel 223. Even in this case, the elevation module 230 may serve to elevate the treating liquid recovery module 220 to a corresponding position. For example, when the first treating liquid is used as the substrate treating liquid, the elevation module 230 may elevate the treating liquid recovery module 220 so that the substrate W is located at a height corresponding to the first opening unit 224 of the first recovery barrel 221.

Meanwhile, in the present embodiment, the elevation module 230 may linearly move the substrate support module 210 in the up-down direction to adjust the relative height of the treating liquid recovery module 220 with respect to the substrate support module 210 (or the substrate W).

However, the present embodiment is not limited thereto. The elevation module 230 may linearly move the substrate support module 210 and the treating liquid recovery module 220 in the up-down direction at the same time to adjust the relative height of the treating liquid recovery module 220 with respect to the substrate support module 210 (or the substrate W).

The spraying module 240 supplies a substrate treating liquid on the substrate W when the substrate W is treated. At least one spraying module 240 may be installed in the substrate treating unit 120. When a plurality of spraying modules 240 are installed in the substrate treating unit 120, each of the spraying modules 240 may spray different substrate treating liquids onto the substrate W.

The spraying module 240 may comprise a nozzle 241, a nozzle support unit 242, a second support shaft 243, and a second driving unit 244.

The nozzle 241 is installed at the end of the nozzle support unit 242. The nozzle 241 may be moved to a process position or a standby position by the second driving unit 244.

In the above, the process position refers to an upper region of the substrate W, and the standby position refers to the remaining region except for the process position. The nozzle 241 may be moved to a process position when discharging the substrate treating liquid onto the substrate W, and after discharging the substrate treating liquid onto the substrate W, the nozzle 241 may leave the process position and move to a standby position.

The nozzle support unit 242 supports the nozzle 241. The nozzle support unit 242 may be formed to extend in a direction corresponding to the longitudinal direction of the spin head 211. That is, the longitudinal direction of the nozzle support unit 242 may be provided along the second direction 20.

The nozzle support unit 242 may be coupled to a second support shaft 243 extending in a direction perpendicular to the longitudinal direction of the nozzle support unit 242. The second support shaft 243 may be formed to extend in a direction corresponding to the height direction of the spin head 211. That is, the longitudinal direction of the second support shaft 243 may be provided along the third direction 30.

The second driving unit 244 rotates and elevates the second support shaft 243 and the nozzle support unit 242 interlocked with the second support shaft 243. According to this function of the second driving unit 244, the nozzle 241 may be moved to a process position or a standby position.

The controller 250 controls the operation of the elevation module 230 and the spraying module 240. Specifically, the controller 250 may control the operations of the first driving unit 233 and the second driving unit 244.

As described above, when the treating liquid providing unit 110 is based on a single tank, the treating liquid providing unit 110 uses the inflow or consumption amount of the substrate treating liquid as a control factor to predict a change in the temperature of the substrate treating liquid even if the substrate treating liquid is occasionally replenished, so that the substrate treating liquid with a constant temperature is provided to the substrate treating unit 120. Hereinafter, this will be described in detail.

Figure 3:
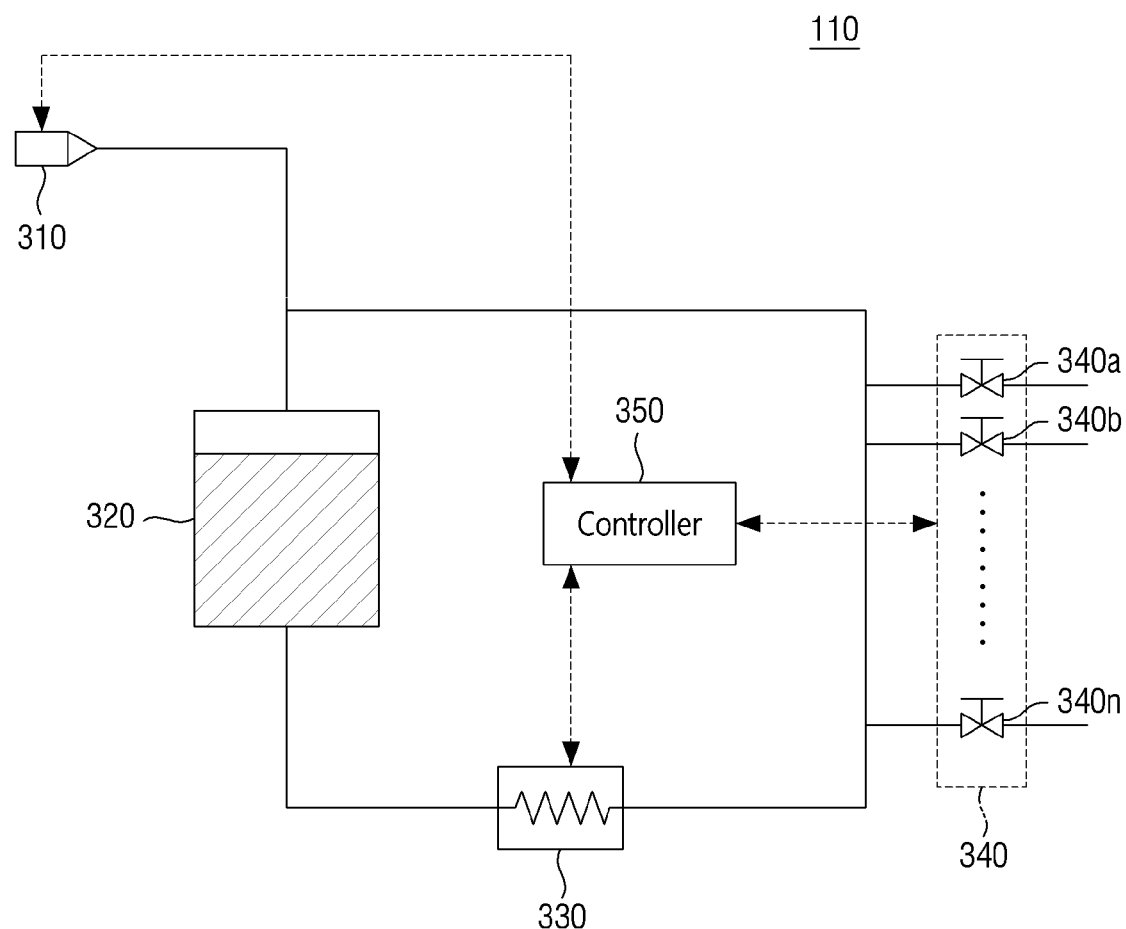
FIG. 3 is a diagram schematically illustrating an internal structure of a treating liquid providing unit constituting the substrate treating apparatus according to the first embodiment of the present disclosure.

FIG. 3 is a diagram schematically illustrating an internal structure of a treating liquid providing unit constituting the substrate treating apparatus according to the first embodiment of the present disclosure.

Referring to FIG. 3, the treating liquid providing unit 110 may comprise a treating liquid supplying module 310, a treating liquid storage module 320, a treating liquid heating module 330, a treating liquid discharging module 340, and a control module 350.

The treating liquid supply module 310 supplies the substrate treating liquid to the treating liquid storage module 320. For this purpose, the treating liquid supplying module 310 may be connected to the treating liquid storage module 320 through a pipe having a predetermined length.

Meanwhile, in order to control the flow of the substrate treating liquid from the treating liquid supplying module 310 to the treating liquid storage module 320, at least one valves may be installed on the pipe connecting the treating liquid supplying module 310 and the treating liquid storage module 320.

The treating liquid storage module 320 temporarily stores the substrate treating liquid until the substrate treating liquid is provided to the substrate treating unit 120. The treating liquid storage module 320 may receive the substrate treating liquid from the treating liquid supplying module 310 and store it.

The treating liquid storage module 320 may be replenished with a corresponding amount of the substrate treating liquid according to the amount of the substrate treating liquid discharged through the treating liquid discharging module 340 (i.e., the amount of the substrate treating liquid moved to the substrate treating unit 120). That is, the amount of the substrate treating liquid discharged through the treating liquid discharging module 340 may be the same as the amount of the substrate treating liquid supplied from the treating liquid supplying module 310 to the treating liquid storage module 320.

However, the present embodiment is not limited thereto. The amount of the substrate treating liquid supplied from the treating liquid supply module 310 to the treating liquid storage module 320 may be less than the amount of the substrate treating liquid discharged through the treating liquid discharging module 340. Meanwhile, in the present embodiment, the amount of the substrate treating liquid supplied from the treating liquid supplying module 310 to the treating liquid storage module 320 may be greater than the amount of the substrate treating liquid discharged through the treating liquid discharging module 340.

The treating liquid heating module 330 heats the substrate treating liquid to increase the temperature of the substrate treating liquid. The treating liquid heating module 330 may heat the substrate treating liquid when the substrate treating liquid is supplied to the substrate treating unit 120. For this purpose, the treating liquid heating module 330 may be installed on a pipe connecting the treating liquid storage module 320 and the treating liquid discharging module 340.

The treating liquid heating module 330 may increase the substrate treating liquid to a designated temperature (e.g., 70° C. to 80° C.). In this case, the substrate treating liquid may move slowly in the treating liquid heating module 330 until it reaches a corresponding temperature. In this embodiment, in consideration of this aspect, in order to increase the movement speed of the substrate treating liquid, a plurality of treating liquid heating modules 330 may be installed on a pipe connecting the treating liquid storage module 320 and the treating liquid discharging module 340.

The plurality of treating liquid heating modules 330 may be disposed in series on a pipe connecting the treating liquid storage module 320 and the treating liquid discharging module 340. However, the present embodiment is not limited thereto. The plurality of treating liquid heating modules 330 may be disposed in parallel on a pipe connecting the treating liquid storage module 320 and the treating liquid discharging module 340. Meanwhile, the plurality of treating liquid heating modules 330 may be disposed in series and parallel on a pipe connecting the treating liquid storage module 320 and the treating liquid discharging module 340.

Figure 4:
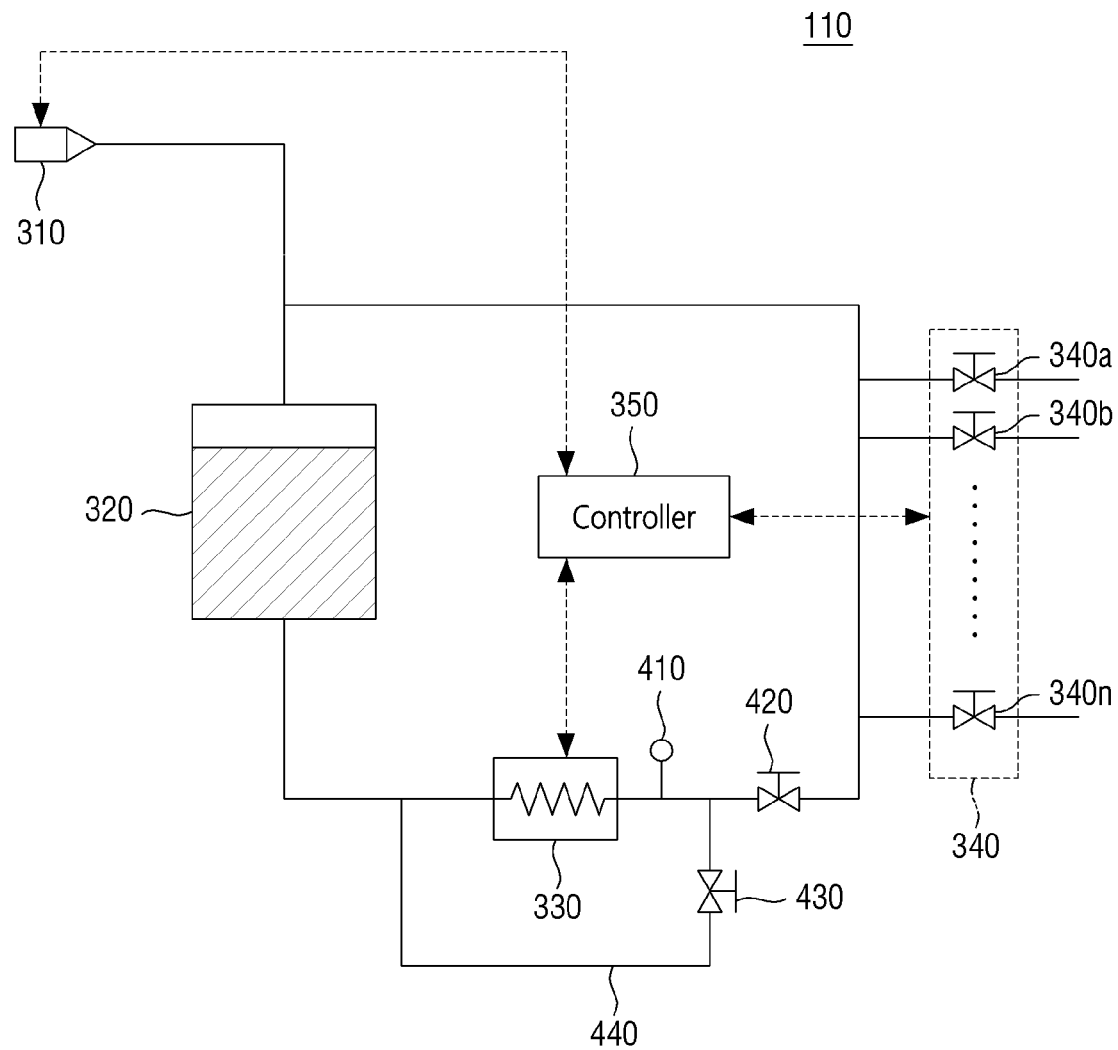
FIG. 4 is a diagram schematically illustrating an internal structure of a treating liquid providing unit constituting a substrate treating apparatus according to a second exemplary embodiment of the present disclosure.

Meanwhile, as shown in FIG. 4, a first temperature measuring sensor 410 may be installed at the rear end of the treating liquid heating module 330 on a pipe connecting the treating liquid storage module 320 and the treating liquid discharging module 340. In this case, the first temperature measuring sensor 410 may measure the temperature of the substrate treating liquid that has passed through the treating liquid heating module 330.

The control module 350 may determine whether the temperature of the substrate treating liquid reaches a target temperature according to the measurement result of the first temperature measuring sensor 410. When it is determined that the temperature of the substrate treating liquid does not reach the target temperature, the control module 350 may close the first on-off valve 420 and open the second on-off valve 430, so that the substrate treating liquid is circulated to the treating liquid heating module 330 through the feedback line 440. FIG. 4 is a diagram schematically illustrating an internal structure of a treating liquid providing unit constituting a substrate treating apparatus according to a second exemplary embodiment of the present disclosure.

It will be described again with reference to FIG. 3.

The treating liquid discharging module 340 discharges the substrate treating liquid that has passed through the treating liquid heating module 330. The substrate treating liquid discharged by the treating liquid discharging module 340 may be moved to the substrate treating unit 120, specifically, the nozzle 241 of the spraying module 240.

The treating liquid discharging module 340 may comprise a plurality of on-off valves 340a, 340b, . . . , 340n. The treating liquid discharging module 340 may supply a predetermined amount of the substrate treating liquid to the substrate treating unit 120 according to the number of the on-off valves 340a, 340b, . . . , 340n that are opened. Meanwhile, the treating liquid discharging module 340 may comprise a single on-off valve.

The control module 350 performs a control function, and may control operations of the treating liquid supplying module 310, the treating liquid heating module 330, and the like.

The control module 350 may measure the amount of the substrate treating liquid discharged from the treating liquid discharging module 340, that is, the consumption amount (or discharge amount) of the substrate treating liquid based on a signal controlling the plurality of on-off valves 340a, 340b, . . . , 340n constituting the treating liquid discharging module 340. The control module 350 may control the treating liquid supplying module 310 based on the consumption amount of the substrate treating liquid, so that an amount corresponding to the consumption amount of the substrate treating liquid is supplied from the treating liquid supplying module 310 to the treating liquid storage module 320.

Also, the control module 350 may predict the temperature of the substrate treating liquid stored in the treating liquid storage module 320 based on the amount of the substrate treating liquid supplied from the treating liquid supplying module 310 to the treating liquid storage module 320, that is, the inflow amount of the substrate treating liquid. In this case, the control module 350 may further use the temperature of the substrate treating liquid supplied from the treating liquid supplying module 310 to the treating liquid storage module 320 to predict the temperature of the substrate treating liquid stored in the treating liquid storage module 320. The temperature of the substrate treating liquid supplied from the treating liquid supplying module 310 to the treating liquid storage module 320 may be known in advance. If the control module 350 can predict the temperature of the substrate treating liquid stored in the treating liquid storage module 320, the surface temperature of the treating liquid heating module 330 may be adjusted based on this, and the time, which takes for the substrate treating liquid to reach the target temperature by the treating liquid heating module 330 may be shortened.

As described above, the inflow amount of the substrate treating liquid may be the same as the consumption amount of the substrate treating liquid, but may be different from the consumption amount of the substrate treating liquid. Hereinafter, this will be described.

Figure 5:
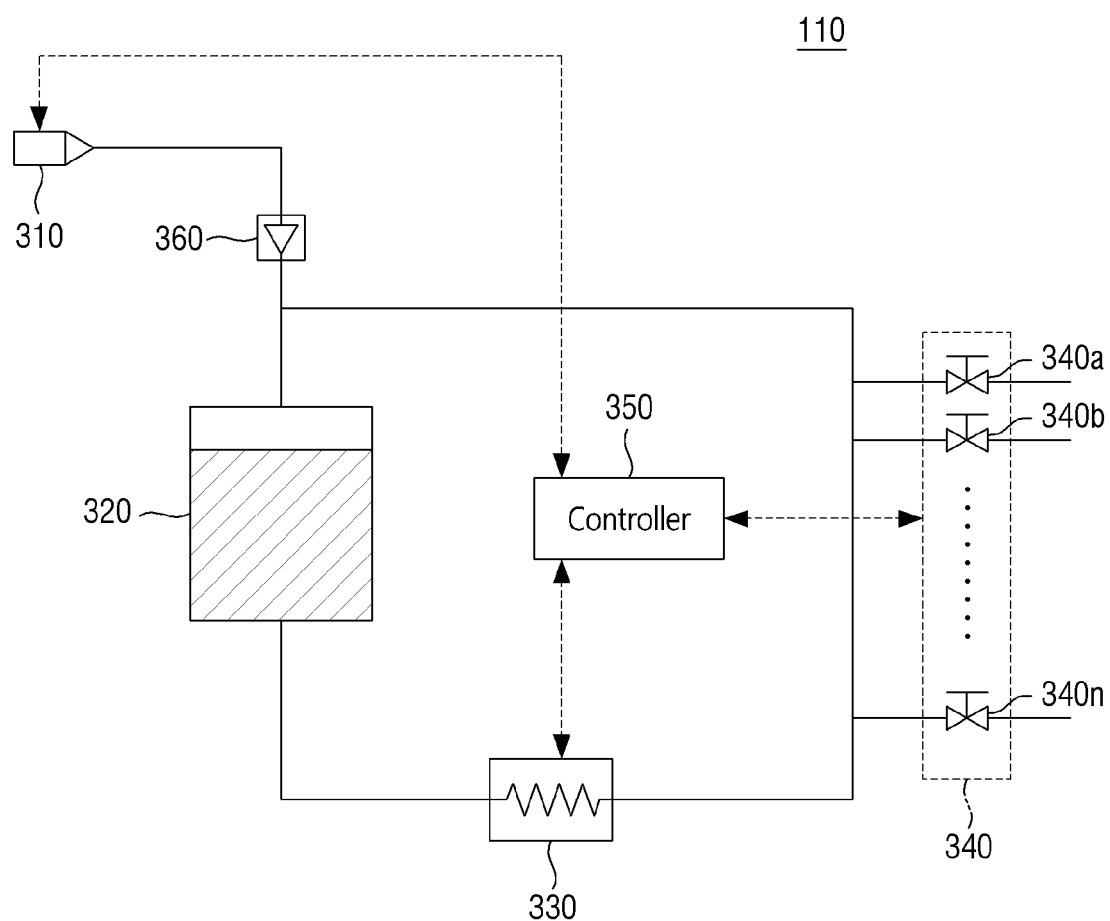
FIG. 5 is a diagram schematically illustrating an internal structure of a treating liquid providing unit constituting a substrate treating apparatus according to a third exemplary embodiment of the present disclosure.

FIG. 5 is a diagram schematically illustrating an internal structure of a treating liquid providing unit constituting a substrate treating apparatus according to a third exemplary embodiment of the present disclosure. The following description refers to FIG. 5.

When the inflow amount of the substrate treating liquid is the same as the consumption amount of the substrate treating liquid, the control unit 350 may determine the inflow amount of the substrate treating liquid based on the consumption amount of the substrate treating liquid, and predict the temperature of the substrate treating liquid stored in the treating liquid storage module 320.

However, if the inflow amount of the substrate treating liquid is different from the consumption amount of the substrate treating liquid, the control unit 350 cannot know the inflow amount of the substrate treating liquid, and accordingly, cannot predict the temperature of the substrate treating liquid stored in the treating liquid storage module 320.

Accordingly, in this case, the treating liquid providing unit 110 may further comprise the first inflow amount measuring module 360.

The first inflow amount measuring module 360 measures the amount of the substrate treating liquid supplied from the treating liquid supplying module 310 to the treating liquid storage module 320. For this purpose, the first inflow amount measuring module 360 may be installed on a pipe connecting the treating liquid supplying module 310 and the treating liquid storage module 320.

When the treating liquid providing unit 110 comprises the first inflow amount measuring module 360, the control module 350 can predict the temperature of the substrate treating liquid stored in the treating liquid storage module 320 based on the amount of the substrate treating liquid measured by the first inflow amount measuring module 360, that is, the inflow amount of the substrate treating liquid supplied from the treating liquid supplying module 310 to the treating liquid storage module 320, and accordingly, the surface temperature of the treating liquid heating module 330 may be adjusted, or the time, which takes for the substrate treating liquid to reach the target temperature by the treating liquid heating module 330 may be shortened.

The substrate treating liquid that is not discharged through the treating liquid discharging module 340 may be circulated and flowed back into the treating liquid storage module 320. However, since the temperature of the substrate treating liquid is increased by the treating liquid heating module 330, the temperature of the substrate treating liquid stored in the treating liquid storage module 320 may change due to the inflow of the substrate treating liquid. Hereinafter, this will be described.

Figure 6:
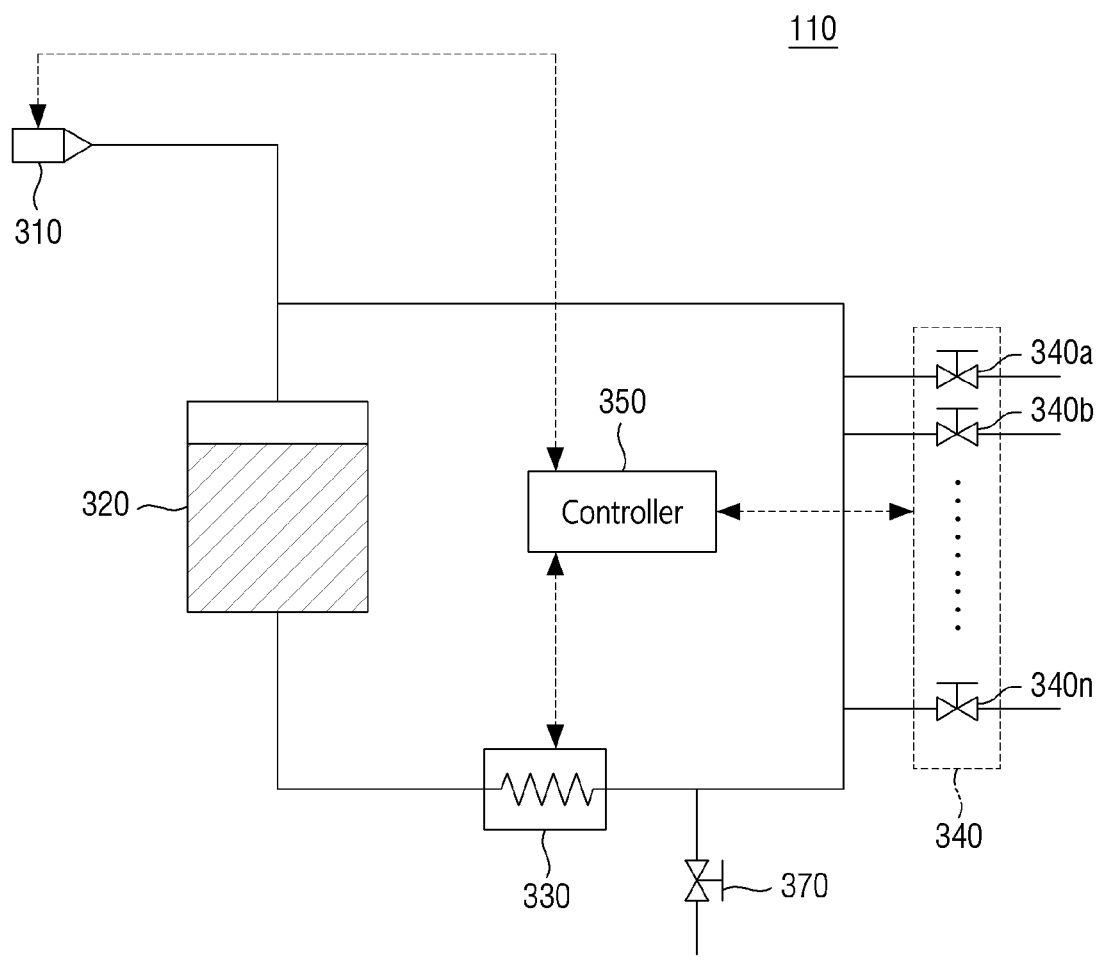
FIG. 6 is a diagram schematically illustrating an internal structure of a treating liquid providing unit constituting a substrate treating apparatus according to a fourth embodiment of the present disclosure.

FIG. 6 is a diagram schematically illustrating an internal structure of a treating liquid providing unit constituting a substrate treating apparatus according to a fourth embodiment of the present disclosure. The following description refers to FIG. 6.

Even when the treating liquid heating module 330 is stopped, the temperature of the substrate treating liquid that passes through the treating liquid heating module 330 and inflows back into the treating liquid storage module 320 may increase due to the thermal energy remaining in the treating liquid heating module 330.

Therefore, in the present embodiment, when the treating liquid heating module 330 is stopped, the substrate treating liquid that has passed through the treating liquid heating module 330 may be discharged to the outside through a drain valve 370. In this case, the control unit 350 may measure the amount of the substrate treating liquid discharged to the outside through the drain valve 370, and supply the corresponding amount from the treating liquid supplying module 310 to the treating liquid storage module 320.

Meanwhile, in the present embodiment, it is also possible to recycle the substrate treating liquid, which has been raised in temperature by the treating liquid heating module 330, without draining it. Hereinafter, this will be described.

Figure 7:
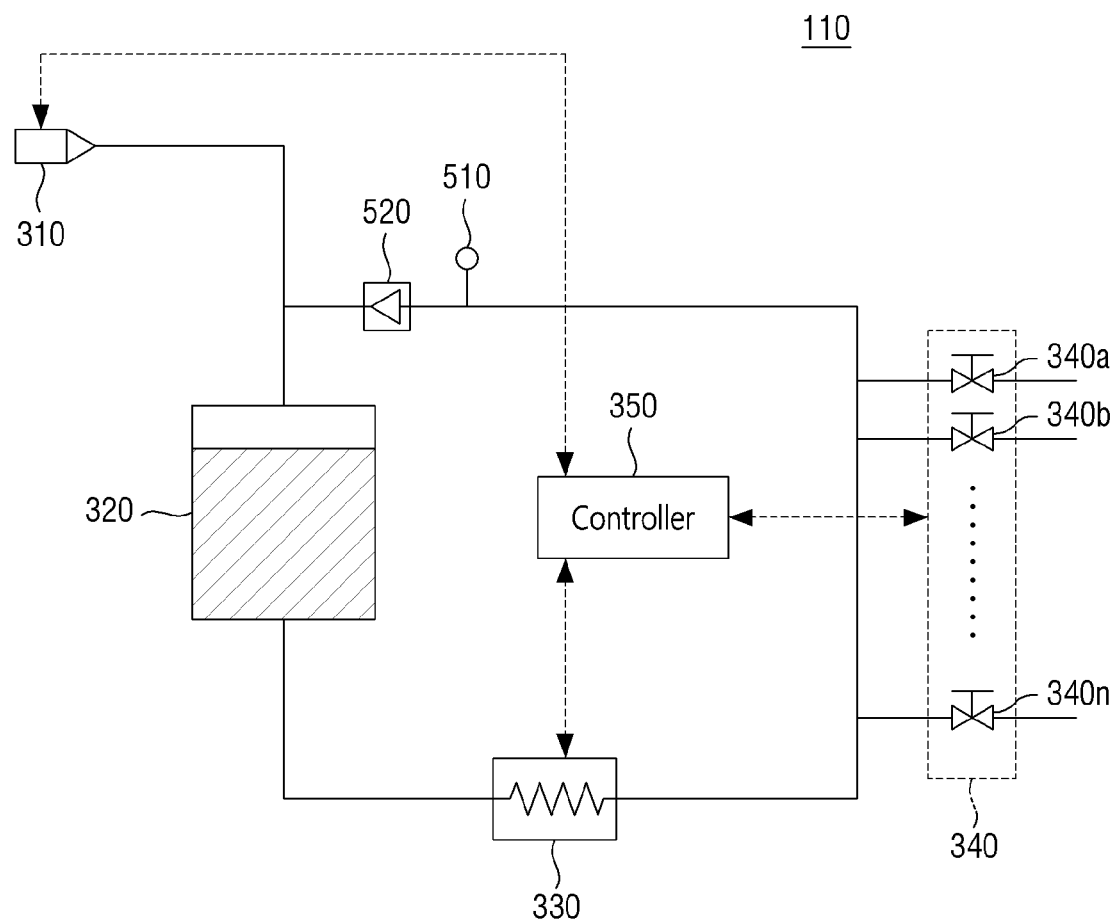
FIG. 7 is a diagram schematically illustrating an internal structure of a treating liquid providing unit constituting a substrate treating apparatus according to a fifth embodiment of the present disclosure.

FIG. 7 is a diagram schematically illustrating an internal structure of a treating liquid providing unit constituting a substrate treating apparatus according to a fifth embodiment of the present disclosure.

Referring to FIG. 7, the treating liquid providing unit 110 may further comprise a second temperature measuring sensor 510 and a second inflow amount measuring module 520.

The second temperature measuring sensor 510 measures the temperature of the substrate treating liquid inflowing back into the treating liquid storage module 320 through the treating liquid heating module 330, and the second inflow amount measuring module 520 measures the amount of the substrate treating liquid inflowing back into the treating liquid storage module 320 through the treating liquid heating module 330.

The second temperature measuring sensor 510 and the second inflow amount measuring module 520 may be installed on the pipe connecting the rear end of the treating liquid heating module 330 and the front end of the treating liquid storage module 320 on the circulation line connecting the front end and the rear end of the treating liquid storage module 320.

The control module 350 can predict the temperature of the substrate treating liquid stored in the treating liquid storage module 320 based on the measurement results of the second temperature measuring sensor 510 and the second inflow amount measuring module 520, that is, the temperature and amount of the substrate treating liquid inflowing back into the treating liquid storage module 320, and accordingly, the surface temperature of the treating liquid heating module 330 may be adjusted, or the time, which takes for the substrate treating liquid to reach the target temperature by the treating liquid heating module 330 may be shortened.

Meanwhile, in the present embodiment, it is also possible to control the substrate treating liquid to be stored up to a first level (h1) in a treating liquid storage module 320 in a normal state, and control the substrate treating liquid to be stored up to a second level (h2, where h2>h1) higher than the first level (h1) in the treating liquid storage module 320 in an emergency state.

Figure 8:
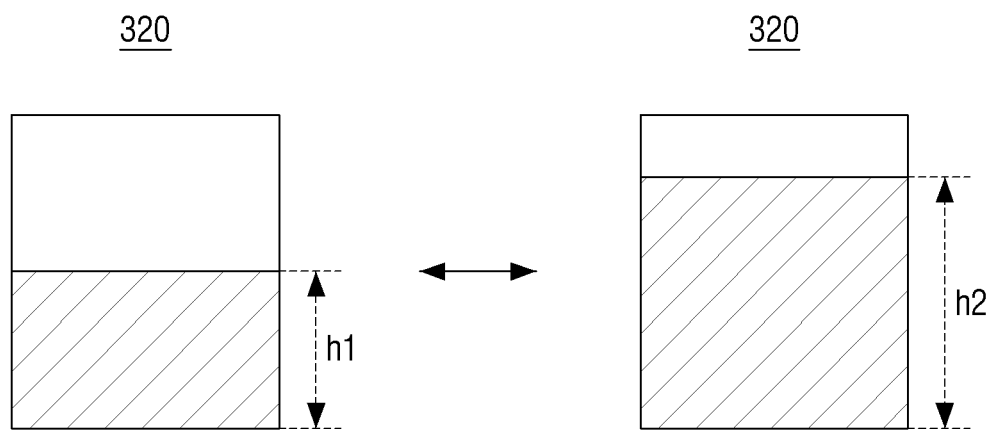
FIG. 8 is a first exemplary diagram for describing various functions of a treating liquid providing unit.

In the above, in the former case, the left view of FIG. 8 may be referenced with, and in the latter case, the right view of FIG. 8 may be referenced with. FIG. 8 is a first exemplary diagram for describing various functions of a treating liquid providing unit.

Figure 9:
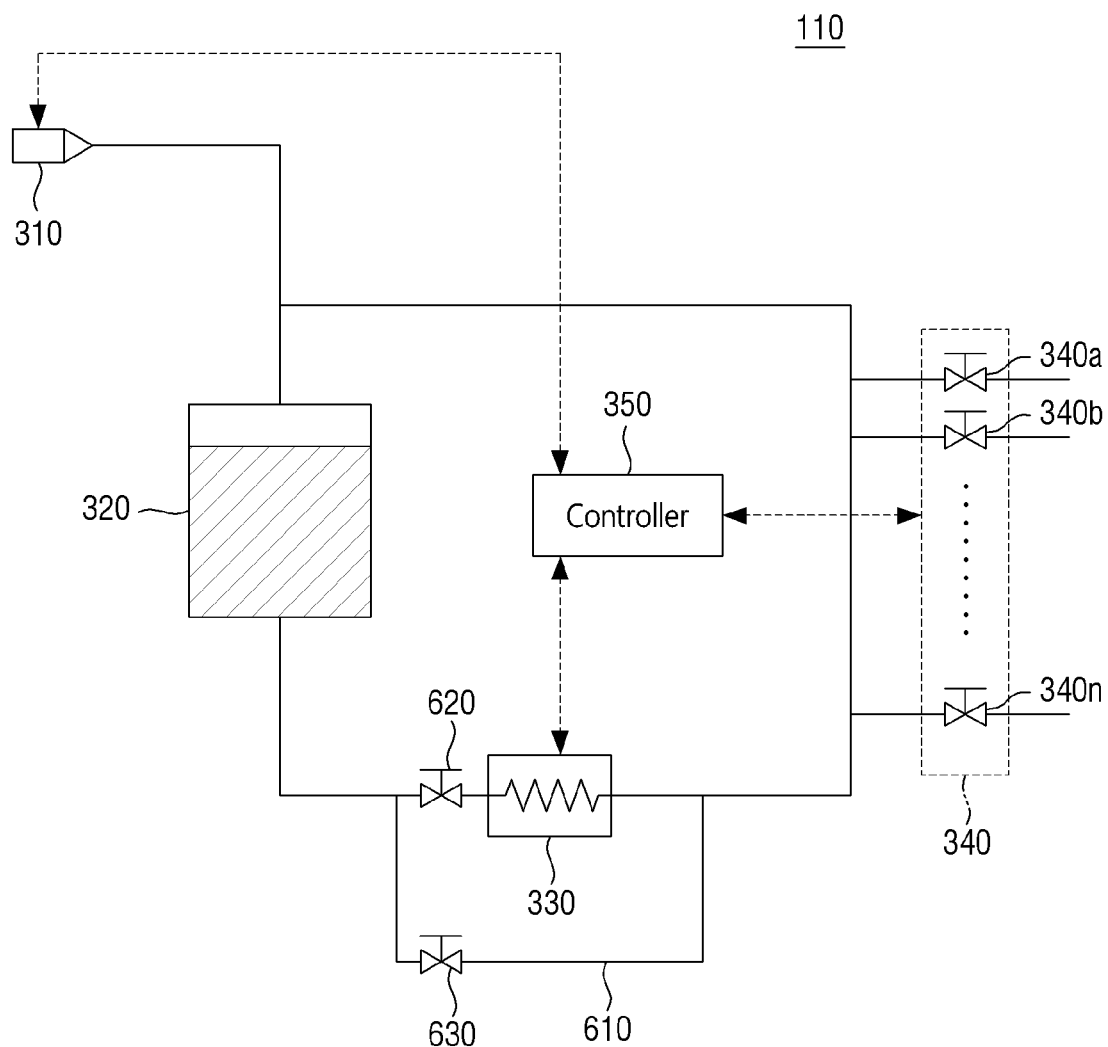
FIG. 9 is a second exemplary diagram for describing various functions of the treating liquid providing unit.

In addition, in the present embodiment, as shown in FIG. 9, a bypass line 610 bypassing the treating liquid heating module 330 is provided, and the third on-off valve 620 and the fourth on-off valve 630 are installed at the first end of the treating liquid heating module 330 and on the bypass line 610, respectively, and in case of emergency (e.g., when the treating liquid heating module 330 is stopped), it is also possible to control the temperature of the circulating substrate treating liquid not to rise due to residual heat of the treating liquid heating module 330 by closing the third on-off valve 620 and opening the fourth on-off valve 630. FIG. 9 is a second exemplary diagram for describing various functions of the treating liquid providing unit.

Figure 10:
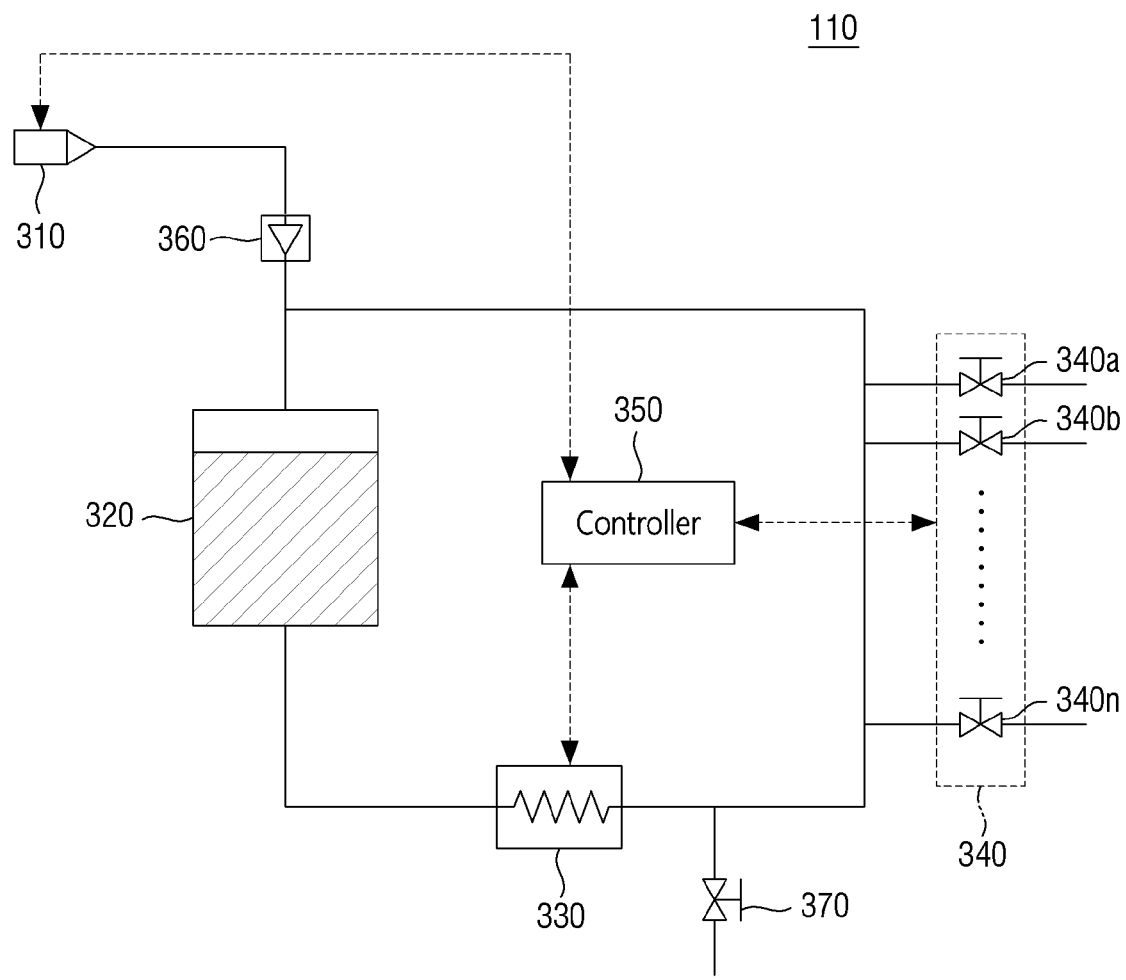
FIG. 10 is a diagram schematically illustrating an internal structure of a treating liquid providing unit constituting a substrate treating apparatus according to a sixth exemplary embodiment of the present disclosure.

Meanwhile, as shown in FIG. 10, the treating liquid providing unit 110 may comprise the first inflow amount measuring module 360 and the drain valve 370 in the configuration shown in FIG. 3. FIG. 10 is a diagram schematically illustrating an internal structure of a treating liquid providing unit constituting a substrate treating apparatus according to a sixth exemplary embodiment of the present disclosure.

The treating liquid providing unit 110 and the substrate treating apparatus 100 according to various embodiments of the present disclosure have been described above with reference to FIGS. 1 to 10. The present disclosure relates to an inline heating system configuration and temperature control method, and it relates to a technology for proactively controlling the output by adding a control standard of the heater so that the temperature deviation depending on whether or not the chemical solution is replenished is minimized when using a single tank-based occasional replenishment supply method and inline heating in supplying a chemical solution (e.g., IPA).

The present disclosure may include the following structures.

First, when supplying a chemical solution in a single tank-based inline heating method, it is possible to have a prior control structure of the heater to minimize fluctuations in temperature due to the occasional supply.

Second, it is possible to have a structure, in which the chemical solution consumption/inflow amount is used as a control factor, and the chemical solution temperature change is predicted and controlled in advance.

Third, it is possible to have a control structure capable of preventing overheating of the chemical solution due to residual heat of the heater even when the consumption of the chemical solution is stopped by configuring the bypass line.

According to the present disclosure, it is possible to optimize the temperature control precision by the configuration predicting the temperature change in the front end of the heater (chemical solution in a tank) and cooling the heater.

Specifically, it is possible to predict the temperature change by recognizing the inflow/consumption amount of the chemical solution in advance by adding a chemical solution usage/inflow amount data interlocking function and adding a bypass configuration, and to prevent temperature hunting through heater pre-control.

In addition, when chemical solution consumption is stopped (i.e., when chemical solution discharging unit vale is off) by receiving the chemical solution discharging unit valve On/Off signal to identify the state of chemical solution consumption, and identifying the new chemical solution inflow amount through the Chemical In stage flow meter, etc., it is possible to prevent temperature hunting by consuming a chemical solution and receiving a new chemical solution through a bypass line.

In summary, the present disclosure is characterized in that the temperature change of the chemical solution can be predicted in advance, and a control method is added to prevent the temperature rise of the chemical solution due to residual heat of the heater.

If the chemical solution consumption/inflow state is added as a control factor, the time, which takes to reach the target temperature, can be shortened by adjusting the heater surface temperature according to the predicted temperature. At this time, since the consumption amount occurs before the inflow amount, it is added as a control factor, and since the inflow amount may be insufficient compared to the consumption amount depending on the environment, it may be added as a control factor.

In addition, when the consumption of the chemical solution is stopped, even if the heater is turned off, the temperature of the chemical solution is overheated due to residual heat, so it can be configured to consume some amount by adding a bypass line. When the chemical solution is consumed, the cold chemical solution inflows, so it is possible to cool the heater and to prevent overheating of the chemical solution.

Although embodiments of the present disclosure have been described with reference to the above and the accompanying drawings, those skilled in the art, to which the present disclosure pertains, can understand that the present disclosure may be practiced in other specific forms without changing its technical spirit or essential features. Therefore, it should be understood that the embodiments described above are illustrative in all respects and not limiting.

What is claimed is:

1. A unit for providing a treating liquid comprising:
a treating liquid storage module configured to store a substrate treating liquid;
a treating liquid discharging module including a plurality of on-off valves and configured to discharge the substrate treating liquid to a substrate treating unit;
a treating liquid heating module installed on a pipe connecting the treating liquid storage module and the treating liquid discharging module and configured to heat the substrate treating liquid; and
a control module configured to control the treating liquid heating module and the plurality of on-off valves, the control module including a computer program and a processor for executing the computer program,
wherein the control module predicts a temperature of the substrate treating liquid in the treating liquid storage module based on an inflow amount and temperature of substrate treating liquid supplied to the treating liquid storage module, and adjusts a surface temperature of the treating liquid heating module based on a temperature prediction result, and then
the treating liquid heating module heats the substrate treating liquid moving to the treating liquid discharging module, and then
the treating liquid discharging module discharges the substrate treating liquid with a constant temperature to the substrate treating unit.

2. The unit of claim 1, wherein the control module recognizes the inflow amount of the substrate treating liquid based on a discharge amount of the substrate treating liquid from the treating liquid storage module.

3. The unit of claim 2, wherein the control module recognizes the inflow amount of the substrate treating liquid as a value equal to the discharge amount of the substrate treating liquid.

4. The unit of claim 1 further comprising:
a first inflow amount measuring module for measuring the inflow amount of the substrate treating liquid to the treating liquid storage module.

5. The unit of claim 4, wherein the first inflow amount measuring module operates to determine that an inflow amount of the substrate treating liquid and a discharge amount of the substrate treating liquid are different from each other.

6. The unit of claim 1 further comprising:
a drain valve for discharging the substrate treating liquid that has passed through the treating liquid heating module to an outside.

7. The unit of claim 6, wherein the drain valve discharges the substrate treating liquid that has passed through the treating liquid heating module to an outside in response to the treating liquid heating module being stopped.

8. The unit of claim 1, wherein the treating liquid storage module stores the substrate treating liquid up to a first height in a normal state, and stores the substrate treating liquid up to a second height higher than the first height in an emergency state.

9. The unit of claim 8, wherein the treating liquid storage module stores the substrate treating liquid up to the second height in response to the treating liquid heating module being stopped.

10. The unit of claim 1 further comprising:
a second temperature measuring sensor for measuring a temperature of the substrate treating liquid that has passed through the treating liquid heating module inflowing back into the treating liquid storage module; and
a second inflow amount measuring module for measuring an amount of the substrate treating liquid that has passed through the treating liquid heating module inflowing back into the treating liquid storage module.

11. The unit of claim 1 further comprising:
a feedback line for connecting a rear end of the treating liquid heating module with a front end of the treating liquid heating module;
a first on-off valve installed on a pipe connecting the rear end of the treating liquid heating module and the treating liquid discharging module; and
a second on-off valve installed on the feedback line.

12. The unit of claim 11 further comprising:
a first temperature measuring sensor for measuring a temperature of the substrate treating liquid that has passed through the treating liquid heating module,
wherein the control module controls opening and closing of the first on-off valve and the second on-off valve according to a measuring result of the first temperature measuring sensor.

13. The unit of claim 1 further comprising:
a bypass line bypassing the treating liquid heating module;
a third on-off valve installed at a front end of the treating liquid heating module; and
a fourth on-off valve installed on the bypass line.

14. The unit of claim 13, wherein the control module controls the third on-off valve and the fourth on-off valve to cause the substrate treating liquid to circulate through the bypass line in response to the treating liquid heating module being stopped.

15. A unit for providing a treating liquid comprising:
a treating liquid storage module configured to store a substrate treating liquid;

a treating liquid discharging module including a plurality of on-off valves and configured to discharge the substrate treating liquid to a substrate treating unit;

a treating liquid heating module installed on a pipe connecting the treating liquid storage module and the treating liquid discharging module and configured to heat the substrate treating liquid;

a first inflow amount measuring module for measuring an amount of the substrate treating liquid to the treating liquid storage module; and a control module configured to control the treating liquid heating module and the plurality of on-off valves, the control module including a computer program and a processor for executing the computer program, wherein the control module predicts a temperature of the substrate treating liquid in the treating liquid storage module based on an inflow amount and temperature of substrate treating liquid supplied to the treating liquid storage module, and adjusts a surface temperature of the treating liquid heating module based on a temperature prediction result, and then the treating liquid heating module heats the substrate treating liquid moving to the treating liquid discharging module, and then the treating liquid discharging module discharges the substrate treating liquid with a constant temperature to the substrate treating unit, and wherein the control module recognizes the inflow amount of the substrate treating liquid based on a discharge amount of the substrate treating liquid from the treating liquid storage module, or recognizes the inflow amount of the substrate treating liquid based on a measuring result of the first inflow amount measuring module.

16. An apparatus for treating a substrate comprising:

a treating liquid providing unit for providing a substrate treating liquid; and a substrate treating unit for treating a substrate using the substrate treating liquid, wherein the treating liquid providing unit comprises, a treating liquid storage module configured to store the substrate treating liquid;

a treating liquid discharging module including a plurality of on-off valves and configured to discharge the substrate treating liquid to a substrate treating unit;

a treating liquid heating module installed on a pipe connecting the treating liquid storage module and the treating liquid discharging module and configured to heat the substrate treating liquid; and a control module configured to control the treating liquid heating module and the plurality of on-off valves, the control module including a computer program and a processor for executing the computer program, a wherein the control module predicts a temperature of the substrate treating liquid in the treating liquid storage module based on an inflow amount and temperature of substrate treating liquid, and adjusts a surface temperature of the treating liquid heating module based on a temperature prediction result, and then the treating liquid heating module heats the substrate treating liquid moving to the treating liquid discharging module, and then the treating liquid discharging module discharges the substrate treating liquid with a constant temperature to the substrate treating unit.

17. The apparatus of claim 16, wherein the substrate treating unit is a cleaning unit for cleaning the substrate.

18. The apparatus of claim 16, wherein the substrate treating liquid is IPA.

19. The apparatus of claim 16, wherein the treating liquid providing unit further comprises, a first inflow amount measuring module for measuring an inflow amount of the substrate treating liquid to the treating liquid storage module.

20. The apparatus of claim 16, wherein the treating liquid providing unit further comprises, a drain valve for discharging the substrate treating liquid that has passed through the treating liquid heating module to an outside.

* * * * *